United States Patent [19]
Gardner et al.

[11] Patent Number: 5,885,879
[45] Date of Patent: Mar. 23, 1999

[54] THIN POLYSILICON MASKING TECHNIQUE FOR IMPROVED LITHOGRAPHY CONTROL

[75] Inventors: Mark I. Gardner, Cedar Creek; Fred N. Hause, Austin, both of Tex.

[73] Assignee: Advanced Micro Devices, Inc.

[21] Appl. No.: 822,941

[22] Filed: Mar. 21, 1997

[51] Int. Cl.⁶ .................................................. H01L 21/336
[52] U.S. Cl. .......................... 438/305; 438/592; 438/618; 438/684
[58] Field of Search ..................................... 438/592, 303, 438/305, 618, 684

[56] References Cited

U.S. PATENT DOCUMENTS

| | | | |
|---|---|---|---|
| 4,514,233 | 4/1985 | Kawabuchi . | |
| 4,577,392 | 3/1986 | Peterson | 438/303 |
| 5,102,815 | 4/1992 | Sanchez | 438/592 |
| 5,352,619 | 10/1994 | Hong . | |
| 5,376,578 | 12/1994 | Hsu et al. | 438/592 |
| 5,674,774 | 10/1997 | Pasch et al. | 438/305 |

*Primary Examiner*—Richard A. Booth
*Attorney, Agent, or Firm*—Kevin L. Daffer; Conley, Rose & Tayon

[57] ABSTRACT

A process for fabricating a semiconductor transistor in which a semiconductor substrate is provided and a gate dielectric layer formed on an upper surface of the semiconductor substrate. A base conductive layer is then deposited on an upper surface of the gate dielectric layer. The base conductive layer is patterned to form base sections of a first and a second gate structure. Source/drain impurity distributions are introduced into the semiconductor substrate using the base sections as a mask to form source/drain structures within the semiconductor substrate. An insulating support layer is then formed on a topography defined by the semiconductor substrate and the base section. The insulating support layer is planarized until an upper surface of the insulating support layer is substantially planar with upper surfaces of the base sections. A second conductive layer is then deposited. The second conductive layer includes gate portions and interconnect portions. The gate portions reside above the base sections of the first and second gate structures. The interconnect portions reside above the insulating support layer. The second conductive layer is then patterned by removing selected areas of the interconnect portions of the second conductive layer. This process completes the first and second gate structures wherein each of the gate structures includes the base section and the gate portion of the second conductive layer. In this manner, a completed thickness of the first and second gate structures is greater than a thickness of the gate structures prior to the introduction of the source/drain impurity distributions.

25 Claims, 2 Drawing Sheets

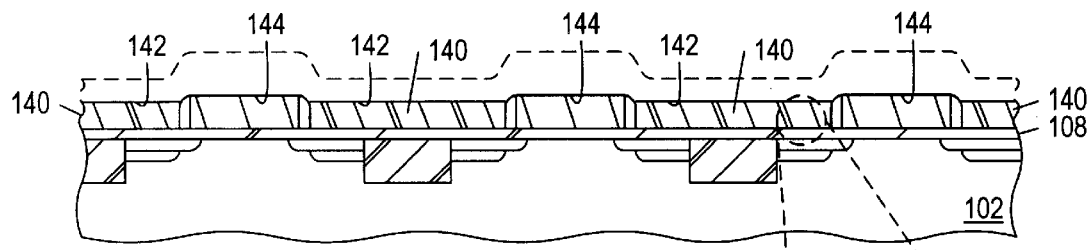
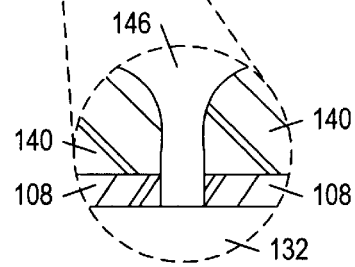
FIG. 5
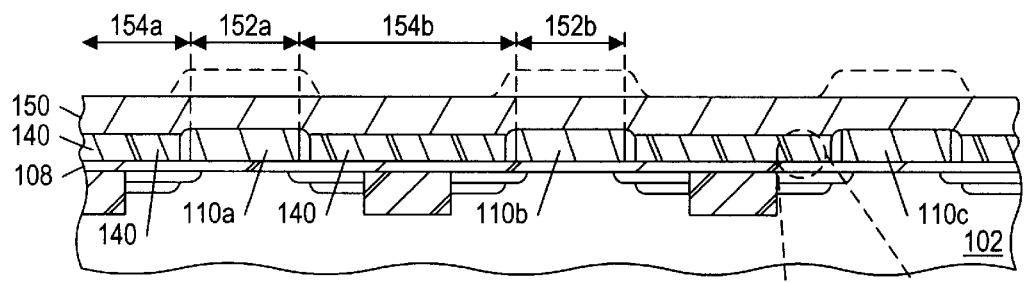
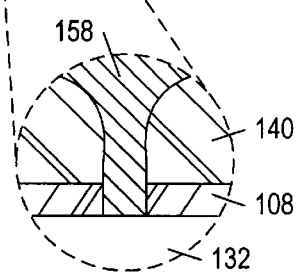
FIG. 6
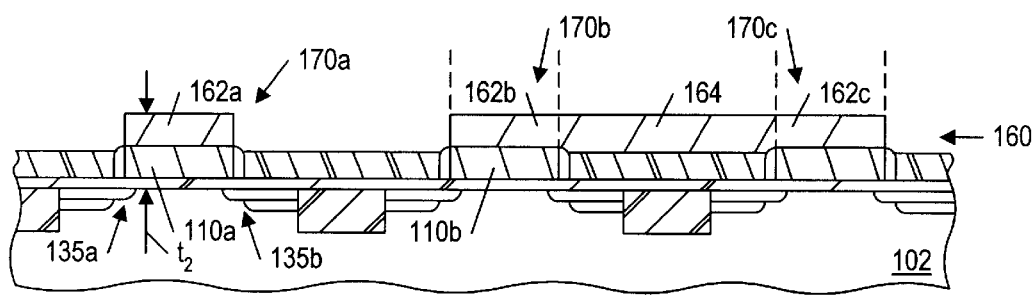

THIN POLYSILICON MASKING TECHNIQUE FOR IMPROVED LITHOGRAPHY CONTROL

BACKGROUND OF THE INVENTION

1. Field of the Invention

The present invention relates to the field of semiconductor processing and more particularly to a two step deposition process for forming gate structures in MOS integrated circuits for improved lithography control coupled with a low overhead local interconnect.

2. Description of the Relevant Art

Integrated circuits employing MOS transistors have been widely known and extensively used in the electronics industry for over 30 years. The basic structure and processing sequence for forming an MOS transistor and MOS integrated circuits has been extensively described in the literature. Typically, a thin oxide is grown on a lightly doped silicon substrate. Thereafter, a gate structure is formed over the thin oxide layer typically by depositing polysilicon and patterning the polysilicon with conventional photolithography masking and etch techniques. After the MOS transistor gate has been formed, it is used as a mask for a subsequent implant during which source/drain structures are formed within the silicon substrate. The source/drain structures are of opposite conductivity type than the silicon substrate. Current flow between the source and drain structures is negligible under equilibrium conditions because back to back pn junctions exist between the source and drain structures. Upon application of an appropriate bias to the MOS transistor gate, however, a conductive channel is induced at the silicon-oxide interface providing a path between the source and drain structure through which current may flow upon appropriate biasing of the source and drain terminals. In this manner, the MOS transistor functions as a switch controlled by the transistor gate.

Present day semiconductor integrated circuits include a large number (i.e., greater than $10^6$) of MOS transistors fabricated within a single silicon substrate. The operating characteristics of each of these transistors are dictated, to a large extent, by the physical geometries of the transistors. It will be appreciated by those skilled in the art that small variations in operating characteristics of the individual transistors fabricated with a given semiconductor process may result in large an often unacceptable variations in the operating characteristics of the semiconductor device as a whole. For example, the speed of an integrated circuit, measured by the time required to complete a function, is related to the operating characteristics of the integrated circuits transistors. The saturated drain current $I_{dsat}$ represents the current flowing from the drain terminal to the source terminal when the gate is biased to induce a strong channel in the silicon substrate (i.e., $V_G > V_T$ where $V_T$ represents the transistor threshold voltage) and the drain terminal is strongly biased with respect to the source terminal (i.e., $V_{DS} >= V_G$). The $I_{dsat}$ characteristic of a particular semiconductor process is a speed indicator because higher drain currents result in faster transistor switching times. The integrated circuit transistor gate, which functions as an input of the transistor in a typical configuration, has a small but finite capacitance associated with it. Because of the gate capacitance, the gate voltage cannot change instantaneously from an "on" value (i.e., $|V_G| >= |V_T|$) to an "off" value. Instead, the output current from the preceding transistor stage, typically the drain current of the preceding stage, charges the gate capacitance such that the gate voltage transitions to a new value. It will be appreciated, therefore, that higher saturated drain current results in faster switching times for a typical integrated circuit.

It is well known in the field of semiconductor processing that the saturated drain current $I_{dsat}$, to a first order approximation, varies directly with the width of the transistor and varies inversely with the length of the transistor. The desire to maximize $I_{dsat}$ has resulted in a steady trend within the semiconductor processing industry towards shorter and shorter channel lengths for integrated circuit transistors. With present day integrated circuit transistors, the channel length is not uncommonly less than one micron. In this submicron region, control of the integrated circuit transistor dimensions becomes increasingly important. Not only is it more important to fabricate smaller and smaller devices, it is equally important to minimize variations among the individual transistors comprising the integrated circuit. Minimizing transistor variability requires improved control over each aspect of the semiconductor process. Typical semiconductor processes include a transistor gate formation sequence in which polysilicon or other suitable material is deposited typically to a thickness in the range of approximately 1000 to 3000 angstroms and thereafter patterned with a photolithography/etch sequence. To minimize variability of the integrated circuit, it is desirable if the etch process used to form the transistor gate produces sidewalls that are substantially perpendicular to the upper surface of the semiconductor substrate. Typically, however, semiconductor processes including polysilicon etch processes result in sloped sidewall profiles. Sloped sidewalls in transistor gates are typically undesirable because the final dimension of the transistor gate varies with the vertical displacement above the oxide-gate interface. Referring to FIG. 1, a gate structure 10 is shown fabricated on a silicon dioxide layer 14 over a silicon substrate 20. Gate structure 10 includes a pair of sidewalls 12a and 12b. Sidewalls 12a and 12b extend between a gate upper surface 13 and a gate-oxide interface at an angle $\alpha$. The slope of sidewalls 12a and 12b represented by the angle $\alpha$ produce a transistor gate 10 in which a lateral dimension $d_1$ of transistor gate 10 near the gate-oxide interface is greater than a lateral dimension $d_2$ describing the lateral dimension of gate 10 proximal to upper surface 13. It will be further appreciated that the discrepancy between the first lateral displacement $d_1$ and the second lateral displacement $d_2$ increases with increasing gate thickness $t_g$. The sloped sidewalls 12a and 12b are undesirable because the lateral dimension of gate 10 as patterned with the photolithography/etch sequence varies from the as drawn dimension. It will be appreciated to those skilled in the art of semiconductor processing that the critical dimension or channel length of the transistor fabricated in FIG. 1 will be defined by the first displacement $d_1$ typically resulting in transistor channel lengths that are greater than desirable. Furthermore, variability in the angle $\alpha$ results in further unwanted variations in the transistor channel length.

In addition to the variability control problems identified with respect to FIG. 1, typical semiconductor processes include a sequence for forming a so called local interconnect layer in addition to the process sequence used to fabricate transistor gate 10. In the typical semiconductor process, the transistor gate is fabricated with a single polysilicon deposition process. If a local interconnect is desired, it must be fabricated with a subsequent deposition of a conductive material. Dedicated processing steps such as a process step dedicated solely to the formation of semiconductor interconnects are typically undesirable because of the increased complexity and cost associated with additional processing.

SUMMARY OF THE INVENTION

The problems identified above are in large part addressed by a process for fabricating a semiconductor transistor in which a transistor gate is formed with a dual deposition process that integrates a local interconnect level. By splitting the gate formation process into two deposition steps, a thin base layer of the gate level can be used as the mask for source/drain implants. The thinner mask reduces the inherent variability of the gate dimensions and results in more predictable and controllable transistor geometries. By integrating a local interconnect level with the second gate deposition step, the process achieves increased control without adding processing complexity or costs.

Broadly speaking, the present invention contemplates a process for fabricating a semiconductor transistor in which a semiconductor substrate is provided and a gate dielectric layer formed on an upper surface of the semiconductor substrate. A base conductive layer is then deposited on an upper surface of the gate dielectric layer. The base conductive layer is patterned to form base sections of a first and a second gate structure. Source/drain impurity distributions are then introduced into the semiconductor substrate using the base sections as a mask to form source/drain structures within the semiconductor substrate. An insulating support layer is then formed on a topography defined by the semiconductor substrate and the base section. The insulating support layer is planarized until an upper surface of the insulating support layer is substantially planar with upper surfaces of the base sections. A second conductive layer is then deposited on an upper surface of the insulating support layer and on upper surfaces of the base sections. The second conductive layer includes gate portions and interconnect portions. The gate portions reside above the base sections of the first and second gate structures. The interconnect portions reside above the insulating support layer. The second conductive layer is then patterned by removing selected areas of the interconnect portions of the second conductive layer.

This process completes the first and second gate structures wherein each of the gate structures includes the base section and the gate portion of the second conductive layer. In this manner, a completed thickness of the first and second gate structures is greater than a thickness of the gate structures prior to the introduction of the source/drain impurity distributions. By using a thinner layer to mask the source/drain impurity distributions, the present invention achieves greater control over the final dimensions of the transistor without undesirably reducing the overall thickness of the gate structure and without increasing the complexity in processes requiring local interconnects.

The semiconductor substrate preferably includes a p-type epitaxial layer formed over a p+ silicon bulk. A preferred resistivity of the p-type epitaxial layer is in the range of approximately 10 to 15 $\Omega$/cm. The formation of the gate dielectric layer is preferably accomplished by thermally oxidizing the upper surface of the semiconductor substrate at a temperature in the range of approximately 600° C. to 900° C. for a duration in the range of approximately 2 to 20 minutes. The deposition of the conductive layer base includes depositing silicon in the presently preferred embodiment. The preferred deposition of the polysilicon is accomplished by thermally decomposing silane in a chemical vapor deposition reactor chamber maintained at a temperature in the range of approximately 580° C. to 650° C. and a pressure of less than approximately 2 torr. In one embodiment, the present invention includes the step of introducing an impurity distribution into the polysilicon to reduce a sheet resistivity of the polysilicon to less than approximately 500 Ohms/square. In a presently preferred embodiment, a thickness of the base conductive layer is in the range of approximately 100 to 1000 angstroms.

The introduction of the source/drain impurity distributions into the semiconductor substrate ideally includes the step of implanting ions of boron, phosphorous, or arsenic. In an embodiment of the present invention in which lightly doped drain (LDD) transistors are desired, the process of introducing the source/drain impurity distribution into the semiconductor substrate includes the steps of implanting a first impurity distribution into lightly doped regions of the semiconductor substrate, forming spacer structures on the sidewalls of the base sections, and implanting a second impurity distribution into heavily doped regions of the semiconductor substrate. The introduction of the second impurity distribution is accomplished in the presence of a spacer structure such that the heavily doped regions of the semiconductor substrate are laterally aligned with exterior sidewalls of the spacer structures.

Preferably the formation of the insulating support layer is accomplished by depositing oxide and chemical mechanical polishing the oxide to achieve the desired planarization. In one embodiment, the deposition of the oxide for the insulating support layer is accomplished by decomposing TEOS in a chemical vapor deposition reactor chamber maintained at a temperature of less than approximately 600° C. and a pressure of less than approximately 2 torr.

In one embodiment, the deposition of the second conductive layer includes thermally decomposing silane in a CVD reactor chamber in much the same manner as the first conductive layer was deposited. In one embodiment, the resistivity of the first and second conductive layers is reduced by introducing an impurity distribution into the respective conductive layer. In one embodiment, the introduction is accomplished by implanting ions of boron, arsenic, or phosphorous to reduce the sheet resistivity of the respective first and second conductive layers to less than approximately 500 Ohms/square.

In a preferred embodiment, a combined thickness of the conductive layer base and the second conductive layer is in the range of approximately 500 to 2500 angstroms. In one embodiment, the process further includes forming contact tunnels through the supporting dielectric layer prior to the depositing of the second conductive layer. By forming contact tunnels prior to the deposition of the second conductive layer, this embodiment of the present invention contemplates that the second conductive layer make contact with the source/drain impurity regions in addition to the conductive gates of other transistors. In a presently preferred embodiment, a pattern produced by the patterning of the second conductive layer includes an interconnect extending from the gate portion of the first conductive gate to the gate portion of the second conductive gate.

The present invention still further contemplates a semiconductor process in which a semiconductor substrate is provided, a gate dielectric formed on an upper surface of the semiconductor substrate, a base portion of a patterned gate layer is formed on an upper surface of the gate dielectric, and source/drain impurity distribution is introduced into the semiconductor substrate using the base portion as a mask, and an upper portion of the patterned gate layer after the introduction of the source/drain impurity distributions.

Preferably, the formation of the gate dielectric is accomplished by thermally oxidizing the upper surface of the semiconductor substrate and oxygen bearing ambient maintained at a temperature in the range of approximately 500° C. to 900° C. for a duration in the range of approximately 2 to 20 minutes. In one embodiment, the formation of the base portion of the patterned gate layer includes depositing a base conductive layer on the gate dielectric and photolithographically patterning the base conductive layer. The introduction of the source/drain impurity distributions preferably comprises ion implanting.

The formation of the upper portion of the patterned gate layer is accomplished forming an insulating support layer and planarizing the insulating support layer until an upper surface of the insulating support layer is substantially planar with an upper surface of the base portion of the patterned gate layer, and depositing a second conductive layer on the upper surface of the insulating support layer and the upper surface of the base portion of the patterned gate layer. In this embodiment, the second conductive gate layer includes a gate portion and an interconnect portion. The gate portion is situated above the base portion of the patterned gate layer. The interconnect portion resides above the insulating support layer. Selected areas of the interconnect portion of the second conductive layer are then removed. Preferably the formation of the insulating support layer is accomplished by depositing an oxide layer with a chemical vapor deposition reactor. The step of depositing the second conductive layer is typically accomplished by thermally decomposing silane in a CVD reactor chamber maintained at a temperature in the range of approximately 500° C. to 650° C. at a pressure of less than approximately 2 torr.

The present invention still further contemplates an integrated circuit that includes a semiconductor substrate, a gate dielectric formed on an upper surface of the semiconductor substrate, a base portion of a patterned gate layer, an upper portion of the patterned gate layer, and source/drain structures within the semiconductor substrate. The base portion of the patterned gate layer includes base portions of a first and a second gate structure. An upper portion of the patterned gate layer includes upper portions of the first and second gate structures formed above the base portion of the first and second gate structures. The source/drain structures are laterally aligned to the base portion of the patterned gate layer. In one embodiment the thickness of the oxide is in the range of approximately 20 to 100 angstroms. The base portion of the patterned gate layer preferably includes polysilicon having a sheet resistivity of less than approximately 500 Ohms/sq. A preferred thickness of the base portion is in the range of approximately 100 to 1000 angstroms. The upper portion of the patterned gate layer includes polysilicon having a sheet resistivity of less than approximately 500 Ohms/sq. In one embodiment, the upper portion of the patterned gate layer includes an interconnect extending between an upper portion of the first gate structure and the upper portion of the second gate structure.

BRIEF DESCRIPTION OF THE DRAWINGS

Other objects and advantages of the invention will become apparent upon reading the following detailed description and upon reference to the accompanying drawings in which:

FIG. 5 is a processing step subsequent to FIG. 4 in which an insulating support layer is deposited and planarized until an upper surface of the insulating support layer is approximately planar with an upper surface of the base conductive layer;

FIG. 6 is a processing step subsequent to FIG. 5 in which a second conductive layer is formed over the base conductive layer and insulating support layer.

Figure 1:
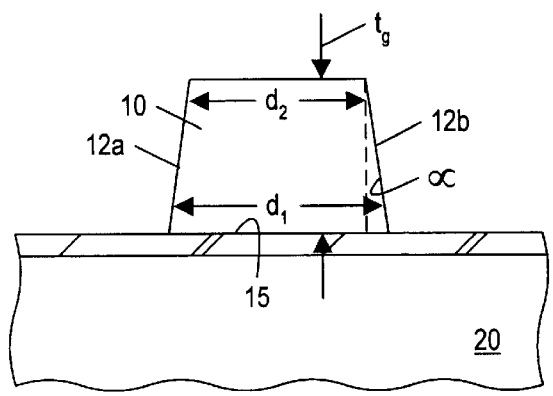
FIG. 1 is a partial cross-sectional view of a semiconductor substrate upon which a gate dielectric and gate structure have been formed.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Figure 2:
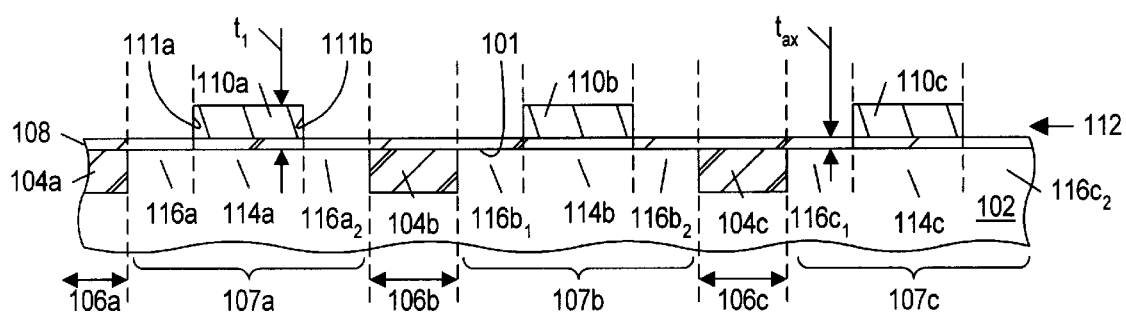
FIG. 2 is a partial cross-sectional view of a semiconductor substrate upon which a patterned base layer has been formed.

Turning now to the drawings, FIGS. 2 through 7 show a processing sequence for forming an integrated circuit transistor according to the present invention. In FIG. 2, semiconductor substrate 102 is provided. In a preferred embodiment useful in the fabrication of CMOS integrated circuits, a starting material suitable for semiconductor substrate 102 includes a p-type epitaxial layer formed on a p+ silicon bulk. A preferred resistivity of the p-type epitaxial layer is in the range of approximately 10 to 15 Ohms-cm. The p+ silicon bulk, in the preferred embodiment, includes an impurity distribution of boron having a peak concentration in excess of approximately $10^{19}$ atoms/cm$^3$. As show in FIG. 2, a plurality of isolation structures 104a, 104b, and 104c (collectively referred to as isolation structures 104) are shown as fabricated within an upper region of semiconductor substrate 102. Isolation structures such as isolation structures 104 provide physical and electrical isolation between adjacent transistors within an integrated circuit. Although other embodiments are possible, the isolation structures 104 shown in FIG. 1 are of the shallow trench isolation variety. A shallow trench isolation structure such as 104 is typically fabricated by etching a trench into semiconductor substrate 102. After the trench has been formed, a dielectric material is typically deposited to fill the trench. To remove portions of the deposited oxide from regions exterior to the isolation trench, a planarization process is typically used after the deposition process. The deposition of the trench oxide in the preferred embodiment is accomplished in a chemical vapor deposition (CVD) reactor chamber using a source such as silane or TEOS. Prior to the deposition of the oxide into the isolation trench, a thermal oxidation process is sometimes used to line the isolation trench with a thermal dielectric to improve the isolation characteristics and reliability of the isolation structure.

After the formation of isolation structures 104 within semiconductor substrate 102, a gate dielectric layer 108 is formed on an upper surface 101 of semiconductor substrate 102. Well known in the field of semiconductor processing, the thermal oxidation of a material such as semiconductor substrate 102 is typically accomplished by immersing semiconductor substrate 102 into an oxygen bearing ambient maintained at a temperature in the range of approximately 600° C. to 900° C. for a duration in the range of approximately 2 to 20 minutes.

Also shown in FIG. 2, a patterned base conductor layer 112 has been formed on an upper surface of gate dielectric 108. Patterned base conductor layer 112 includes a plurality of base sections 110a, 110b, and 110c (collectively referred to as base sections 110) of respective gate structures (shown and described in greater detail below). The formation of patterned base conductive layer 112 is accomplished in a preferred embodiment by depositing a base conductive layer on an upper surface of gate dielectric layer 108. The deposition of the base conductive layer, in a preferred embodiment, is accomplished by depositing polysilicon with a CVD reactor. More specifically, the deposition of the base conductive layer is accomplished by thermally decomposing silane in a CVD reactor chamber maintained at a temperature in the range of approximately 580° C. to 650° C. for a duration in the range of approximately 2 to 60 minutes. In an alternative embodiment of patterned base conductive layer 112, not shown in the drawing, the base conductive layer may be comprised of an alternative conductive material such as aluminum, copper, tungsten, or other appropriate metal. In embodiments of the base conductive layer comprising polysilicon, an impurity distribution may be introduced into the polysilicon layer to reduce a sheet resistivity of the polysilicon to less than approximately 500 Ohms/sq. The introduction of an impurity distribution into a polysilicon layer is preferably accomplished with an ion implantation process as is well known.

The present invention contemplates the formation of a thin source/drain mask to obtain better control over the transistor dimensions. In the presently preferred embodiment, a first thickness $t_1$ of the base conductive layer is in the range of approximately 100 to 1000 angstroms. This film is significantly thinner than a typical gate structure found in MOS technologies. Because the first thickness $t_1$ of patterned base conductive layer 112 may be thinner than desirable for subsequent processing, the present invention contemplates a second deposition process to effectively add thickness to the base sections 110 as will be shown in greater detail below. A local interconnect pattern may be integrated into the second deposition process to provide an additional level of interconnect with a minimum of additional processing. Each gate structure 110 includes a pair of substantially vertical sidewalls 111a and 111b. Each gate structure 110 is aligned over a respective channel region 114 of semiconductor substrate 102. Each channel region 114 is laterally displaced between a pair of source/drain regions 116a1 and 116a2.

Figure 3:
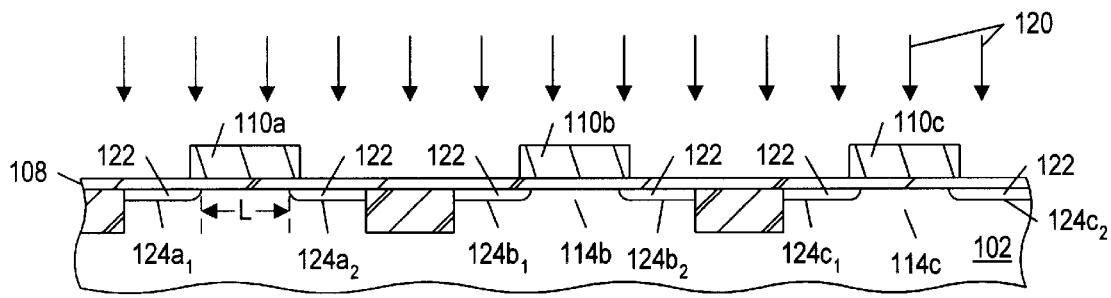
FIG. 3 is a processing step subsequent to FIG. 2 in which source/drain impurity distributions are introduced into the semiconductor substrate using the conductive base layer as a mask.

Turning now to FIG. 3, an impurity distribution 122 is introduced into lightly doped source/drain regions 124 of semiconductor substrate 102 preferably through the use of an ion implantation step represented in FIG. 3 as reference numeral 120. Ion implantation 120 introduces appropriate impurities such as boron, phosphorous, or arsenic into semiconductor substrate 102. The presence of patterned base conductive layer 112 during ion implantation 120 effectively prevents impurity distribution 122 from entering channel regions 114 of semiconductor substrate 102. Although ion implantation 120 may comprise a single implant, it is to be understood that the present invention is equally applicable to NMOS and CMOS processes. In a CMOS embodiment of the present invention, it will be appreciated to those skilled in the art that ion implantation 120 may represent a pair of ion implantation steps in which one of the implant steps introduces p-type impurities such as boron into n-well regions of the semiconductor substrate for fabricating PMOS devices while a second implant introduces n-type impurities such as arsenic or phosphorous into p-well regions of the semiconductor substrate for forming n-channel devices.

In a presently preferred embodiment, ion implantation 120 is a lightly doped drain implant for which the implant energy is in the range of approximately 10 to 50 keV and the implant dose is in the range of approximately $10^{11}$ to $10^{13}$ atoms/cm$^2$. Lightly doped drain transistors beneficially reduce the maximum electric field within the transistor channel region thereby minimizing unwanted hot electron injection. Because the first thickness $t_1$ of patterned base conductive layer 112 is less than the typical thickness of an NMOS gate structure, the channel length L, which represents the lateral displacement between the channel boundaries of lightly doped source/drain region 124a1 and lightly doped source/drain region 124a2, varies less than approximately 5% from the as drawn lateral dimension of the base section 110a.

Figure 4:
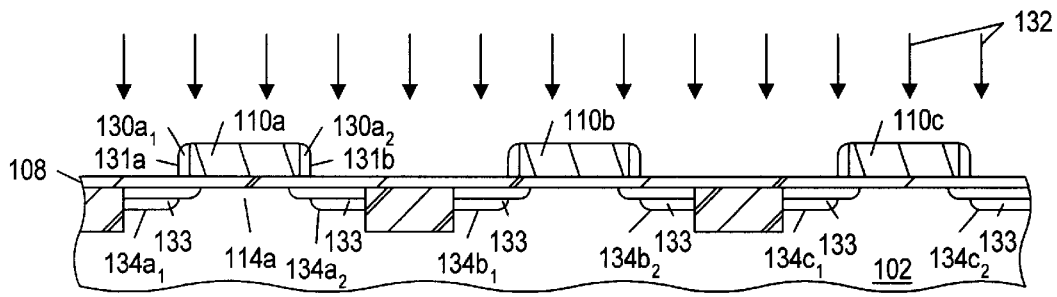
FIG. 4 is a processing step subsequent to FIG. 3 in which a heavily doped source/drain impurity distribution is introduced into the semiconductor substrate in the presence of spacer structures formed on the sidewalls of the base structures.

Turning now to FIG. 4, a second ion implantation 132 is performed to introduce a heavily doped impurity distribution 133 into heavily doped source/drain regions 134 of semiconductor substrate 102. Prior to the execution of second implant 132, spacer structures 130 are formed on the sidewalls 111 of each base section 110. Formation of dielectric spacers such as spacer structure 130 upon sidewalls of an existing structure is preferably accomplished by depositing a substantially conformal dielectric layer on the semiconductor topography and, thereafter, performing an anisotropic etch process with a minimum overetch to just clear the portions of the conformal dielectric layer that occur over horizontal portions of the underlying topography. Conformal dielectric layers may be deposited by thermally decomposing TEOS or other suitable substances in a chemical vapor deposition reactor chamber maintained at a temperature of less than approximately 650° C. and a pressure of less than approximately 2 torr. Spacer structures 130, in conjunction with base structures 110 form an implant mask for second ion implantation 132. Because spacer structures 130 extend laterally from sidewalls 111 of base structures 110, the heavily doped impurity distribution will occur within semiconductor substrate 102 in heavily doped regions 134 which are laterally displaced from channel boundaries of lightly doped source/drain regions 124 by a displacement approximately equal to a lateral dimension of spacer structures 130. By laterally displacing the heavily doped source/drain regions with respect to the lightly doped source/drain regions, the potential drop from the source/drain terminal is effectively distributed across the lightly doped region resulting in less severe electric fields within channel region 114. In a presently preferred embodiment, second ion implantation 132 suitable for use with heavily doped drain structures is typically carried out at an energy in the range of approximately 30 to 100 keV using an implant dose in the range of approximately $10^{14}$ to $10^{16}$ atoms/cm$^2$. These implant parameters typically result in the formation of a deeper and more heavily doped impurity distribution than lightly doped regions 124. For CMOS embodiments of the present invention, ion implantation 132 may comprise multiple implant steps necessary to introduce p-type impurities into the p-channel devices an n-type impurities into the n-channel device regions. Impurities suitable for use with second implantation 132, like the impurities for first implantation 120, include boron, phosphorous, and arsenic.

Turning now to FIG. 5, an insulating support layer 140 is formed on the semiconductor topography. Insulating support layer 140 is preferably formed by depositing an insulating material such as CVD TEOS and, thereafter, planarizing the insulating layer with a planarization process such as a chemical mechanical polish possibly in combination with one or more resist/etch sequences. The planarization of the insulating support layer is preferably carried out until an upper surface 142 of insulating support layer 140 is substantially planar with an upper surface 144 of first patterned base conductive layer 112. In this manner, insulating support layer 140 provides a physical base, in regions lacking a base section 110, for supporting a subsequent conductive layer. In one embodiment, represented in FIG. 5 by the exploded view, a contact tunnel 146 may be formed into and through insulating support layer 140 and gate dielectric layer 108 to provide a path to heavily doped source/drain impurity distribution 132 within semiconductor substrate 102. The use of contact tunnels such as contact tunnel 146 increases the flexibility of a subsequently formed local interconnect by providing a means through which the local interconnect layer may contact source/drain regions. In the absence of contact tunnels such as contact 146, a subsequently formed interconnect level would only be able to interconnect gate structures of the individual transistors. In the embodiment of the present invention in which contact tunnels 146 are employed, an additional mask and etch sequence is required to form contact tunnels 146. Turning now to FIG. 6, a second conductive layer 150 is deposited upon the semiconductor topography. Second conductive layer 150 includes gate portions represented as reference numeral 152 in the drawing and interconnect portions represented as reference numeral 154 in the drawing. Gate portions 152 of second conductive layer 150 are those portions located over a base structure 110. Interconnect portions 154, on the other hand, are those portions of conductive layer 150 not residing over a base structure 110. In the preferred embodiment, the material used for second conductive layer 150 is typically substantially identical to the material used for base structure 110. Thus, in embodiments of the present invention in which base structures 110 comprise polysilicon, second conductive layer 150 is fabricated with a CVD polysilicon deposition process. In another embodiment, base structure 110 may comprise a silicon while second conductive layer 150 may comprise a more conductive material such as aluminum, copper, titanium, or other appropriate metal or metal alloy. In an embodiment of the present invention in which contact tunnels 146 were formed in insulating dielectric layer 140 as previously described with respect to FIG. 5, an exploded view is shown in FIG. 6 in which a conductive plug 158 has filled contact tunnel 146 thereby forming a conductive path between heavily doped source/drain impurity distribution 132 and second conductive layer 150. Conductive plug 158 may be comprised of a substantially identical material to second conductive layer 150 and may, in one embodiment, be deposited simultaneously with the deposition of second conductive layer 150. In other embodiments, conductive plug 158 may be comprised of a material other than the material used for second conductive layer 150. For example, tungsten is commonly used to plug contact tunnels in interlevel dielectric layers and may be suitably utilized in a similar manner in the present invention.

Figure 7:
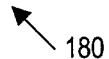
FIG. 7 is a processing step subsequent to FIG. 6 in which the second base layer is patterned by removing selected areas of the second conductive layer aligned over the insulating support layer.

Turning now to FIG. 7, second conductive layer 150 is patterned to produce a patterned second conductive layer 160. Patterned second conductive layer 160 includes gate portions 162 formed over corresponding base structures 110 and further comprises interconnect structure 164 extending between a pair of adjacent gate portions 162b and 162c. The patterning of second conductive layer 150 completes the formation of gate structures 170. Each gate structure 170 includes a base section 110 and a gate portion 162. A final thickness of gate structure 170a is represented in FIG. 7 as $t_2$. In a presently preferred embodiment, the gate structure final thickness $t_2$ is in the range of approximately 500 to 2500 angstroms. The additional thickness of gate structure 170 provided by gate portion 162 of second conductive layer 150 beneficially provides increased margin for a subsequent etch process such that the risk of etching through gate structure 170 is minimized. In other words, gate structure 170 may be required to act as an etch stop during subsequent semiconductor processing and the first thickness $t_1$ may be insufficient. In addition, by integrating interconnect structure 164 into the deposition of second conductive layer 150, the present invention achieves the photolithographic benefits of the thin gate structures and the processing margin benefits of the thick gate structure without significantly increasing dedicated processing steps and without sacrificing the local interconnect layer.

In this manner, the present invention contemplates an integrated circuit 180. Integrated circuit 180 includes semiconductor substrate 102, gate dielectric 108 formed on an upper surface 101 of semiconductor substrate 102, a patterned base conductive layer 112 formed on gate dielectric 108, a patterned second conductive layer 160, and source/drain structures 135a and 135b. Patterned base conductive layer 112 includes base sections 110a and 110b of a first and a second gate structure 170a and 170b. Patterned second conductive layer 160 includes upper portions 162a and 162b of first and second gate structures 170a. The upper portions 162 are formed above base sections 110. Source/drain structures 135a and 135b are laterally aligned with base section 110 of patterned base conductive layer 112. Semiconductor substrate 102 is preferably a single crystal silicon as described previously. Gate dielectric 108 suitably comprises a thermal oxide with a thickness in the range of approximately 20 to 100 angstroms. Patterned base conductive layer 112, in one embodiment, is polysilicon with a sheet resistivity of less than approximately 500 Ω/square. A preferred thickness of patterned base conductive layer 112 is in the range of approximately 100 to 1000 angstroms. Patterned second conductive layer 160, in one embodiment, comprises polysilicon with a sheet resistivity less than approximately 500 Ω/square. In another embodiment, patterned second conductive layer 160 may be comprised of a metal such as aluminum, copper, tungsten, titanium, or other appropriate metal or alloy. In one embodiment, patterned second conductive layer 160 includes an interconnect 164 extending between upper portions 162b and 162c of a first gate structure 170b and a second gate structure 170c.

It will be appreciated to those skilled in the art that the present invention is suitable for improving photolithographic control over critical dimensions of a semiconductor transistor while simultaneously integrating a local interconnect level into the gate formation sequence. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A process for fabricating a semiconductor transistor, comprising:

providing a semiconductor substrate;

forming a gate dielectric layer on an upper surface of said semiconductor substrate;

depositing a base conductive layer on an upper surface of said gate dielectric layer;

patterning said base conductive layer to form respective base sections of a first and a second gate structure;

introducing source/drain impurity distributions into said semiconductor substrate using said base sections as a mask to form source/drain structures within said semiconductor substrate;

forming an insulating support layer on a topography defined by said upper surface of said semiconductor substrate and said base sections and planarizing said insulating support layer until an upper surface of said insulating support layer is substantially planar with respective upper surfaces of said base sections;

depositing a second conductive layer on an upper surface of said insulating support layer and on upper surfaces of said base sections, wherein said second conductive layer comprises gate portions and interconnect portions, wherein said gate portions reside above said base sections of said first and second gate structures and wherein said interconnect portions reside above said insulating support layer;

patterning said second conductive layer by removing selected areas of said interconnect portions of said second conductive layer to complete said first and second gate structures, wherein each said gate structure comprises said base section and said gate portion of said second conductive layer, whereby a completed thickness of said first and second gates structures is greater than a thickness of gate structures prior to the step of introducing said source/drain impurity distributions.

2. The process of claim 1, wherein the step of providing said semiconductor substrate comprises providing a p-type epitaxial layer formed over a p+ silicon bulk.

3. The process of claim 2, wherein a resistivity of said p-type epitaxial layer is in the range of approximately 10 to 15 Ω-cm.

4. The process of claim 1, wherein, the step of forming said gate dielectric layer comprises thermally oxidizing said upper surface of said semiconductor substrate at a temperature in the range of approximately 600° to 900° C. for a duration in the range of approximately 2 to 20 minutes.

5. The process of claim 1, wherein the step of depositing said conductive layer base comprises depositing polysilicon.

6. The process of claim 5, wherein the step of depositing said polysilicon comprises thermally decomposing silane in a chemical vapor deposition reactor chamber maintained at a temperature in the range of approximately 580° to 650° C. and a pressure of less than approximately 2 torr.

7. The process of claim 5, further comprising introducing an impurity distribution into said polysilicon wherein a sheet resistivity of said polysilicon is reduced to less than approximately 500 Ω/square.

8. The process of claim 1, wherein a thickness of said base conductive layer is in the range of approximately 100 to 1000 angstroms.

9. A semiconductor process comprising:

providing a semiconductor substrate;

forming a gate dielectric on an upper surface of said semiconductor substrate;

forming a base portion of a patterned gate layer on an upper surface of said gate dielectric;

introducing source/drain impurity distributions into said semiconductor substrate using said base portion of said patterned gate layer as a mask;

forming an upper portion of said patterned gate layer after the step of introducing said source/drain impurity distributions, wherein said upper portion comprises a conductive layer having a gate portion and a co-planar interconnect portion extending laterally beyond the base position to a source/drain impurity distribution associated with a transistor laterally spaced from said base portion.

10. The process of claim 9, wherein the step of forming said gate dielectric comprises thermally oxidizing said upper surface of said semiconductor substrate in an oxygen bearing ambient maintained at a temperature in the range of approximately 500° to 900° C. for a duration in the range of approximately 2 to 20 minutes.

11. The process of claim 9, wherein the step of forming said base portion of said patterned gate layer comprises depositing a base conductive layer on said gate dielectric and photolithographically patterning said base conductive layer.

12. The process of claim 9, wherein the step of introducing said source/drain impurity distributions comprises ion implanting.

13. The process of claim 9, wherein the step of forming said upper portion of said patterned gate layer comprises:

forming an insulating support layer on a topography defined by said base portion of said patterned gate layer and said upper surface of said semiconductor substrate;

planarizing said insulating support layer until an upper surface of said insulating support layer is substantially planar with an upper surface of said base portion of said patterned gate layer;

depositing a second conductive layer on said upper surface of said insulating support layer and said upper surface of said base portion of said patterned gate layer, wherein said second conductive layer comprises a gate portion and an interconnect portion, wherein said gate portion is situated above said base portion of said patterned gate layer and further wherein said interconnect portion resides above said insulating support layer; and removing selected areas of said interconnect portion of said second conductive layer.

14. The process of claim 13, wherein the step of forming said insulating support layer comprises depositing an oxide layer with a chemical vapor deposition reactor.

15. The process of claim 13, wherein the step of depositing said second conductive layer comprises thermally decomposing silane in a chemical vapor deposition reactor chamber maintained at a temperature in the range of approximately 580° to 650° C. and a pressure of less than approximately 2 torr.

16. The process of claim 1, wherein introducing said source/drain impurity distributions into said semiconductor substrate comprises implanting ions selected from the group consisting of boron, phosphorus, and arsenic.

17. The process of claim 1, wherein introducing said source/drain impurity distribution into said semiconductor substrate comprises:

implanting a first impurity distribution into lightly doped regions of said semiconductor substrate using said conductive layer base as an implant mask, wherein said lightly doped regions are laterally aligned with sidewalls of said base sections of said first and second gate structures;

forming spacer structures on said sidewalls of said base sections; and implanting a second impurity distribution into heavily doped regions of said semiconductor substrate, wherein said heavily doped regions are laterally aligned with exterior sidewalls of said spacer structures.

18. The process of claim 1, wherein forming said insulating support layer comprises depositing oxide and further wherein the step of planarizing said insulating support layer comprises chemical mechanical polishing.

19. The process of claim 18, wherein depositing said oxide comprises decomposing TEOS in a chemical vapor deposition reactor chamber maintained at a temperature of less than approximately 650° C. and a pressure of less than approximately 2 torr.

20. The process of claim 1, wherein depositing said second conductive layer comprises thermally decomposing silane in a chemical vapor deposition reactor chamber maintained at a temperature in the range of approximately 580° to 650° C. and a pressure of less than approximately 2 torr.

21. The process of claim 20, further comprising introducing an impurity distribution into said second conductive layer, wherein a sheet resistivity of said second conductive layer is less than approximately 500 $\Omega$/square.

22. The process of claim 1, wherein a combined thickness of said conductive layer base and said second conductive layer is in the range of approximately 500 to 2500 angstroms.

23. The process of claim 1, further comprising, prior to the deposition of said second conductive layer, forming contact tunnels through said supporting dielectric layer to said source/drain impurity distributions.

24. The process of claim 9, wherein said forming an upper portion comprises extending the interconnect portion to a gate portion of the transistor.

25. The process of claim 1, wherein a pattern produced by the step of patterning said second conductive layer comprises an interconnect extending from said gate portion of said first conductive gate to said gate portion of said second conductive gate.

* * * * *